(12) United States Patent
Frougier et al.

(10) Patent No.: US 10,269,983 B2
(45) Date of Patent: Apr. 23, 2019

(54) STACKED NANOSHEET FIELD-EFFECT TRANSISTOR WITH AIR GAP SPACERS

(71) Applicant: GLOBALFOUNDRIES Inc., Grand Cayman (KY)

(72) Inventors: Julien Frougier, Albany, NY (US); Ruilong Xie, Niskayuna, NY (US); Hui Zang, Guilderland, NY (US); Kangguo Cheng, Schenectady, NY (US); Tenko Yamashita, Schenectady, NY (US); Chun-chen Yeh, Danbury, CT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/590,409

(22) Filed: May 9, 2017

(65) Prior Publication Data

US 2018/0331232 A1 Nov. 15, 2018

(51) Int. Cl.
*H01L 29/78* (2006.01)
*H01L 29/06* (2006.01)
(Continued)

(52) U.S. Cl.
CPC .... *H01L 29/78696* (2013.01); *H01L 29/0665* (2013.01); *H01L 29/42356* (2013.01);
(Continued)

(58) Field of Classification Search
CPC .. H01L 29/06–29/0615; H01L 29/0657; H01L 29/0661; H01L 29/0669; H01L 29/0676; H01L 29/068; H01L 29/0684–29/0696; H01L 29/0869; H01L 29/0873; H01L 29/0886; H01L 29/41; H01L 29/413; H01L 29/02; H01L 29/0638; H01L 29/08; H01L 29/0843–29/0856; H01L 29/0891; H01L 29/1025; H01L 29/1029; H01L 29/1033; H01L 29/1037; H01L 29/1095; H01L 29/12; H01L 29/41725; H01L 29/41783;
(Continued)

(56) References Cited

U.S. PATENT DOCUMENTS 5,736,446 A 4/1998 Wu
5,759,913 A 6/1998 Fulford, Jr. et al.
(Continued)

*Primary Examiner* — Maliheh Malek
(74) *Attorney, Agent, or Firm* — Thompson Hine LLP; Anthony Canale

(57) ABSTRACT

Structures for a nanosheet field-effect transistor and methods for forming a structure for a nanosheet field-effect transistor. A fin is formed that includes a first nanosheet channel layer and a second nanosheet channel layer arranged in a vertical stack. A cavity is formed between a portion of the first nanosheet channel layer and a portion of the second nanosheet channel layer. An epitaxially-grown source/drain region is connected with the portion of the first nanosheet channel layer and the portion of the second nanosheet channel layer. A gate structure is formed that includes a section located in a space between the first nanosheet channel layer and the second nanosheet channel layer. The cavity is surrounded by the first nanosheet channel layer, the second nanosheet channel layer, the section of the gate structure, and the source/drain region to define an air gap spacer.

20 Claims, 7 Drawing Sheets

(51) Int. Cl.
    *H01L 29/786*     (2006.01)
    *H01L 29/66*     (2006.01)
    *H01L 29/423*     (2006.01)
    *H01L 29/12*     (2006.01)
    *H01L 29/41*     (2006.01)

(52) U.S. Cl.
    CPC .. *H01L 29/66742* (2013.01); *H01L 29/66795* (2013.01); *H01L 29/785* (2013.01)

(58) Field of Classification Search
    CPC ...... H01L 29/41791; H01L 29/7853–29/7854; H01L 29/66803; H01L 2029/7858
    See application file for complete search history.

(56) References Cited

U.S. PATENT DOCUMENTS

| | | | | |
|---|---|---|---|---|
| 5,770,507 | A | 6/1998 | Chen et al. | |
| 5,869,379 | A | 2/1999 | Gardner et al. | |
| 5,914,519 | A | 6/1999 | Chou et al. | |
| 5,959,337 | A | 9/1999 | Gardner et al. | |
| 5,972,763 | A | 10/1999 | Chou et al. | |
| 6,468,877 | B1 | 10/2002 | Pradeep et al. | |
| 8,022,439 | B2 * | 9/2011 | Kajiyama | B82Y 10/00 257/192 |
| 8,097,515 | B2 * | 1/2012 | Bangsaruntip | B82Y 10/00 257/24 |
| 8,994,081 | B2 * | 3/2015 | Leobandung | H01L 29/78609 257/18 |
| 9,219,154 | B1 * | 12/2015 | Cheng | H01L 29/7853 |
| 9,368,512 | B1 * | 6/2016 | Cheng | H01L 27/1211 |
| 9,425,291 | B1 * | 8/2016 | Balakrishnan | H01L 29/66795 |
| 9,496,400 | B1 * | 11/2016 | Balakrishnan | H01L 29/785 |
| 9,515,138 | B1 * | 12/2016 | Doris | H01L 29/267 |
| 9,608,065 | B1 * | 3/2017 | Bergendahl | H01L 27/0886 |
| 9,620,590 | B1 * | 4/2017 | Bergendahl | H01L 29/0673 |
| 9,666,693 | B1 * | 5/2017 | Doris | H01L 29/6681 |
| 9,704,863 | B1 * | 7/2017 | Cheng | H01L 27/092 |
| 9,735,246 | B1 * | 8/2017 | Basker | H01L 29/42392 |
| 9,748,335 | B1 * | 8/2017 | Bentley | H01L 29/0673 |
| 9,799,748 | B1 * | 10/2017 | Xie | H01L 29/66553 |
| 9,812,449 | B2 * | 11/2017 | Obradovic | H01L 27/088 |
| 9,905,643 | B1 * | 2/2018 | Bergendahl | H01L 29/0673 |
| 9,917,152 | B1 * | 3/2018 | Cheng | H01L 29/7848 |
| 9,947,804 | B1 * | 4/2018 | Frougier | H01L 29/78696 |
| 9,960,232 | B2 * | 5/2018 | Obradovic | H01L 27/088 |
| 9,984,936 | B1 * | 5/2018 | Xie | H01L 21/823481 |
| 9,985,138 | B2 * | 5/2018 | Bergendahl | H01L 29/78618 |
| 9,991,261 | B2 * | 6/2018 | Mitard | H01L 27/092 |
| 9,991,352 | B1 * | 6/2018 | Frougier | H01L 29/42364 |
| 10,069,015 | B2 * | 9/2018 | Cheng | H01L 29/78696 |
| 10,103,238 | B1 * | 10/2018 | Zang | H01L 21/311 |
| 2008/0017934 | A1 * | 1/2008 | Kim | H01L 29/0657 257/401 |
| 2013/0341704 | A1 * | 12/2013 | Rachmady | H01L 29/66545 257/327 |
| 2014/0001441 | A1 * | 1/2014 | Kim | H01L 29/0673 257/29 |
| 2015/0079751 | A1 * | 3/2015 | Alptekin | H01L 29/785 438/283 |
| 2015/0091100 | A1 * | 4/2015 | Xie | H01L 21/76224 257/401 |
| 2015/0236120 | A1 * | 8/2015 | Hashemi | H01L 29/42392 257/9 |
| 2015/0295084 | A1 * | 10/2015 | Obradovic | H01L 29/7845 257/347 |
| 2015/0372111 | A1 * | 12/2015 | Koh | B82Y 10/00 257/29 |
| 2016/0020305 | A1 * | 1/2016 | Obradovic | H01L 29/7391 257/39 |
| 2016/0126310 | A1 * | 5/2016 | Rodder | H01L 29/41758 257/9 |
| 2016/0204228 | A1 * | 7/2016 | Tapily | H01L 29/66742 438/151 |
| 2016/0365411 | A1 | 12/2016 | Yeh et al. | |
| 2017/0040321 | A1 * | 2/2017 | Mitard | H01L 29/78684 |
| 2017/0053998 | A1 * | 2/2017 | Kim | H01L 29/42392 |
| 2017/0062598 | A1 * | 3/2017 | Seo | B82Y 10/00 |
| 2017/0069763 | A1 * | 3/2017 | Doris | H01L 21/0228 |
| 2017/0110542 | A1 * | 4/2017 | Lee | H01L 29/1033 |
| 2017/0110554 | A1 * | 4/2017 | Tak | H01L 29/4991 |
| 2017/0117409 | A1 * | 4/2017 | Balakrishnan | H01L 29/7848 |
| 2017/0141207 | A1 * | 5/2017 | Cheng | H01L 29/6681 |
| 2017/0170294 | A1 * | 6/2017 | Doris | H01L 29/6681 |
| 2017/0194430 | A1 * | 7/2017 | Wood | H01L 29/0649 |
| 2017/0213888 | A1 * | 7/2017 | Chang | H01L 29/0673 |
| 2017/0213911 | A1 * | 7/2017 | Balakrishnan | H01L 29/7848 |
| 2017/0221708 | A1 * | 8/2017 | Bergendahl | H01L 29/66742 |
| 2017/0221992 | A1 * | 8/2017 | Chang | H01L 29/0676 |
| 2017/0222006 | A1 * | 8/2017 | Suh | H01L 23/5283 |
| 2017/0236900 | A1 * | 8/2017 | Chang | H01L 29/0673 257/347 |
| 2017/0250250 | A1 * | 8/2017 | Bentley | H01L 29/0673 |
| 2017/0250261 | A1 * | 8/2017 | Kim | H01L 29/0673 |
| 2017/0271474 | A1 * | 9/2017 | Obradovic | H01L 27/088 |
| 2017/0317169 | A1 * | 11/2017 | Bentley | H01L 21/02532 |
| 2017/0323941 | A1 * | 11/2017 | Obradovic | H01L 29/0665 |
| 2017/0330934 | A1 * | 11/2017 | Zhang | H01L 29/0665 |
| 2017/0358457 | A1 * | 12/2017 | Jang | H01L 21/2633 |
| 2017/0358665 | A1 * | 12/2017 | Song | H01L 29/66795 |
| 2018/0006113 | A1 * | 1/2018 | Cheng | H01L 29/0665 |
| 2018/0006139 | A1 * | 1/2018 | Seo | H01L 29/66795 |
| 2018/0047834 | A1 * | 2/2018 | Chao | H01L 29/0847 |
| 2018/0047835 | A1 * | 2/2018 | Chao | H01L 29/0847 |
| 2018/0047853 | A1 * | 2/2018 | Chang | H01L 29/78696 |
| 2018/0061945 | A1 * | 3/2018 | Bergendahl | H01L 29/0673 |
| 2018/0061946 | A1 * | 3/2018 | Bergendahl | H01L 29/66545 |
| 2018/0061992 | A1 * | 3/2018 | Bergendahl | H01L 29/78618 |
| 2018/0076095 | A1 * | 3/2018 | Cheng | H01L 27/092 |
| 2018/0076226 | A1 * | 3/2018 | Leobandung | H01L 27/1211 |
| 2018/0082902 | A1 * | 3/2018 | Balakrishnan | H01L 21/823412 |
| 2018/0083046 | A1 * | 3/2018 | Cheng | H01L 27/1211 |
| 2018/0083118 | A1 * | 3/2018 | Bergendahl | H01L 29/6681 |
| 2018/0090582 | A1 * | 3/2018 | Adusumilli | H01L 29/45 |
| 2018/0090624 | A1 * | 3/2018 | Cheng | H01L 29/78696 |
| 2018/0114834 | A1 * | 4/2018 | Cheng | H01L 29/0673 |
| 2018/0122899 | A1 * | 5/2018 | Guillorn | H01L 29/0665 |
| 2018/0122900 | A1 * | 5/2018 | Cheng | H01L 29/6653 |
| 2018/0138268 | A1 * | 5/2018 | Smith | H01L 29/0673 |
| 2018/0138279 | A1 * | 5/2018 | Xie | H01L 29/41775 |
| 2018/0151561 | A1 * | 5/2018 | Cantoro | H01L 27/088 |
| 2018/0158952 | A1 * | 6/2018 | Balakrishnan | H01L 29/778 |
| 2018/0190829 | A1 * | 7/2018 | Song | H01L 29/78618 |
| 2018/0219101 | A1 * | 8/2018 | Bergendahl | H01L 29/0673 |
| 2018/0240871 | A1 * | 8/2018 | Cheng | H01L 29/0673 |
| 2018/0254321 | A1 * | 9/2018 | Wostyn | H01L 29/0653 |
| 2018/0277430 | A1 * | 9/2018 | Xie | H01L 21/76879 |
| 2018/0277656 | A1 * | 9/2018 | Chao | H01L 29/66553 |
| 2018/0301531 | A1 * | 10/2018 | Xie | H01L 29/0673 |
| 2018/0301564 | A1 * | 10/2018 | Kwon | H01L 29/78618 |
| 2018/0358435 | A1 * | 12/2018 | Mochizuki | H01L 29/0649 |

* cited by examiner

STACKED NANOSHEET FIELD-EFFECT TRANSISTOR WITH AIR GAP SPACERS

BACKGROUND

The present invention relates to semiconductor device fabrication and integrated circuits and, more specifically, to structures for a nanosheet field-effect transistor and methods for forming a structure for a nanosheet field-effect transistor.

Device structures for a field-effect transistor generally include a body region, a source and a drain defined in the body region, and a gate electrode configured to switch carrier flow in a channel formed in the body region. When a control voltage exceeding a designated threshold voltage is applied to the gate electrode, carrier flow occurs in an inversion or depletion layer in the channel between the source and drain to produce a device output current. The body region and channel of a planar field-effect transistor are located beneath the top surface of a substrate on which the gate electrode is supported.

A fin-type field-effect transistor (FinFET) is a non-planar device structure that may be more densely packed in an integrated circuit than planar field-effect transistors. A FinFET may include a fin consisting of a solid unitary body of semiconductor material, heavily-doped source/drain regions formed in sections of the body, and a gate electrode that wraps about a channel located in the fin body between the source/drain regions. The arrangement between the gate structure and fin body improves control over the channel and reduces the leakage current when the FinFET is in its 'Off' state in comparison with planar transistors. This, in turn, enables the use of lower threshold voltages than in planar transistors, and results in improved performance and reduced power consumption.

Stacked nanowire or nanosheet field-effect transistors have been developed as an advanced type of FinFET that may permit additional increases in packing density. The body of a stacked nanosheet field-effect transistor may include multiple semiconductor nanosheets arranged in a three-dimensional array with a gate stack formed on the nanosheet channel regions. The gate stack may surround all sides of the channel region of each semiconductor nanosheet in a gate-all-around arrangement.

SUMMARY

In embodiments of the invention, a method is provided for forming a field-effect transistor. A fin is formed that includes a first nanosheet channel layer and a second nanosheet channel layer arranged in a vertical stack. A cavity is formed between a portion of the first nanosheet channel layer and a portion of the second nanosheet channel layer. An epitaxially-grown source/drain region is connected with the portion of the first nanosheet channel layer and the portion of the second nanosheet channel layer. A gate structure is formed that includes a section located in a space between the first nanosheet channel layer and the second nanosheet channel layer. The cavity is surrounded by the first nanosheet channel layer, the second nanosheet channel layer, the section of the gate structure, and the source/drain region to define an air gap spacer.

In embodiments of the invention, a structure is provided for a field-effect transistor. The structure includes a fin including a first nanosheet channel layer and a second nanosheet channel layer arranged in a vertical stack, a gate structure including a section located vertically in a space between the first nanosheet channel layer and the second nanosheet channel layer, and a source/drain region connected with a portion of the first nanosheet channel layer and a portion of the second nanosheet channel layer. An air gap spacer is surrounded by the portion of the first nanosheet channel layer, the portion of the second nanosheet channel layer, the section of the gate structure, and the source/drain region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
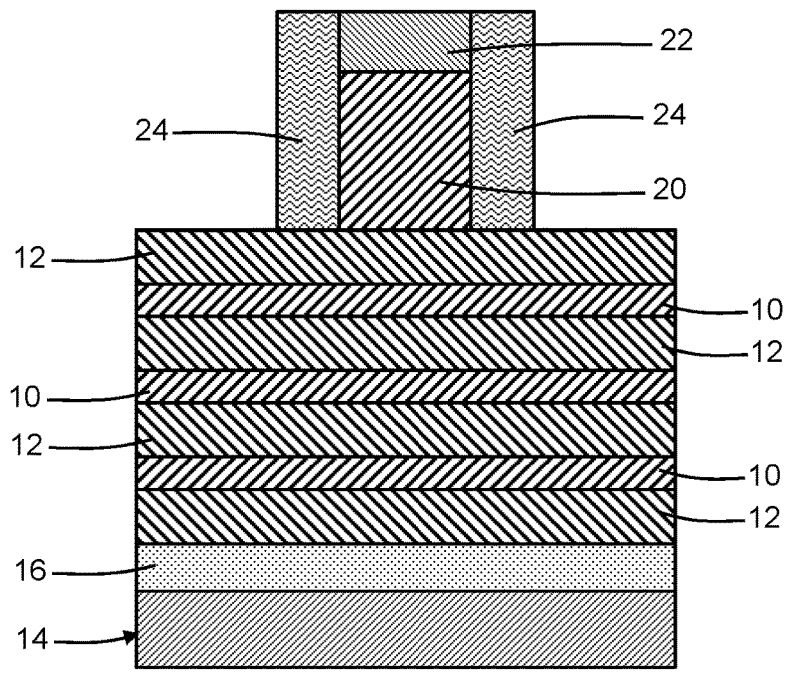
FIGS. 1-9 are cross-sectional views of a device structure at successive stages of the processing method in accordance with embodiments of the invention.

With reference to FIG. 1 and in accordance with embodiments of the invention, semiconductor layers 10 and sacrificial semiconductor layers 12 are formed in an alternating series as a vertical layer stack on a substrate 14. The substrate 14 includes a dielectric layer 16, which may be the buried oxide (BOX) layer of a semiconductor-on-insulator (SOI) substrate or dielectric isolation in a bulk substrate. The semiconductor layers 10 may be nanowires or nanosheets that are composed of a semiconductor material, such as silicon (Si). The sacrificial semiconductor layers 12 may be composed of a semiconductor material, such as silicon germanium (SiGe). The semiconductor layers 10 and 12 may be formed by an epitaxial growth process, and at least the semiconductor layers 10 may be undoped. The semiconductor material of the sacrificial semiconductor layers 12 is selected to be removed selective to the semiconductor material of the semiconductor layers 10. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The number of semiconductor layers 10 and sacrificial semiconductor layers 12 may differ from the number depicted in the representative embodiment.

A sacrificial gate structure 20 is formed on the top surface of the layer stack that includes the semiconductor layers 10 and sacrificial semiconductor layers 12. The sacrificial gate structure 20 may be composed of a semiconductor material, such as polysilicon, that is deposited by CVD and patterned with reactive ion etching (ME). The sacrificial gate structure 20 may be covered by a dielectric cap 22 on its top surface and dielectric spacers 24 that are located adjacent to its vertical sidewalls. The dielectric spacers 24 may be composed of a low-k dielectric material, such as silicon oxycarbide (SiOC) or silicon boron carbide nitride (SiBCN).

Figure 2:
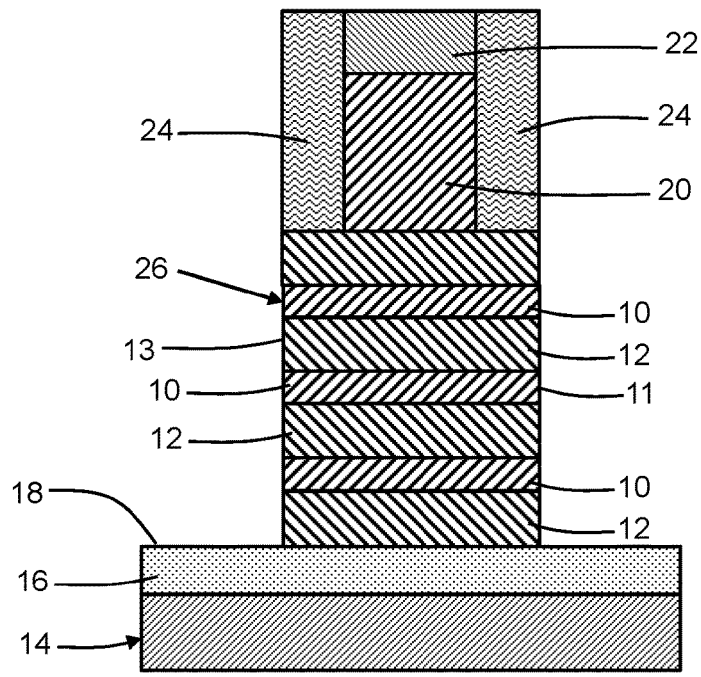

With reference to FIG. 2 in which like reference numerals refer to like features in FIG. 1 and at a subsequent fabrication stage of the processing method, a fin 26 may be formed from the semiconductor layers 10 and the sacrificial semiconductor layers 12 by photolithography and etching, such as a sidewall imaging transfer (SIT) process or self-aligned double patterning (SADP). The fin 26 is a three-dimensional body that includes a trimmed layer stack with alternating sections of the semiconductor layers 10 and sacrificial semiconductor layers 12. The fin 26 projects in a vertical direction relative to a top surface 18 of the dielectric layer 16. The sacrificial gate structure 20 and its dielectric spacers 24 furnish an etch mask during the etching process forming the fin 26. The vertical surfaces 11 of the semiconductor layers 10 and the vertical surfaces 13 of the sacrificial semiconductor layers 12 are contained in respective vertical planes at the sidewalls of the fin 26, and the top surface 18 of the dielectric layer 16 is revealed adjacent to the fin 26 after the fin 26 is patterned.

Figure 3:
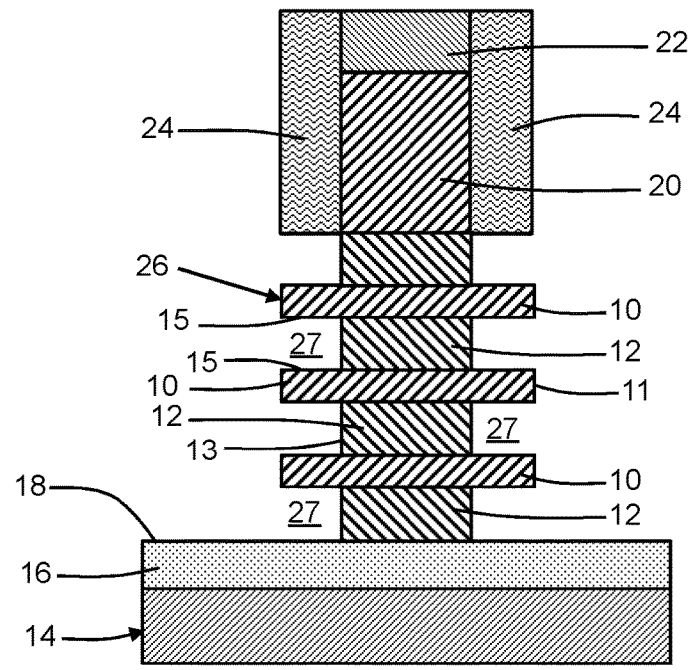

With reference to FIG. 3 in which like reference numerals refer to like features in FIG. 2 and at a subsequent fabrication stage of the processing method, the sacrificial semiconductor layers 12 are laterally recessed relative to the semiconductor layers 10 with an etching process that etches the material constituting the sacrificial semiconductor layers 12 selective to the material constituting the semiconductor layers 10. The sacrificial semiconductor layers 12 are only partially removed by the etching process. In particular, the vertical surfaces 13 of the sacrificial semiconductor layers 12 are recessed laterally relative to the vertical surfaces 11 of the semiconductor layers 10, which creates cavities 27 that partially expose spaced-apart horizontal surfaces 15 of the semiconductor layers 10. The cavities 27 are arranged in a vertical direction between the spaced-apart horizontal surfaces 15 of adjacent pairs of the semiconductor layers 10.

Figure 4:
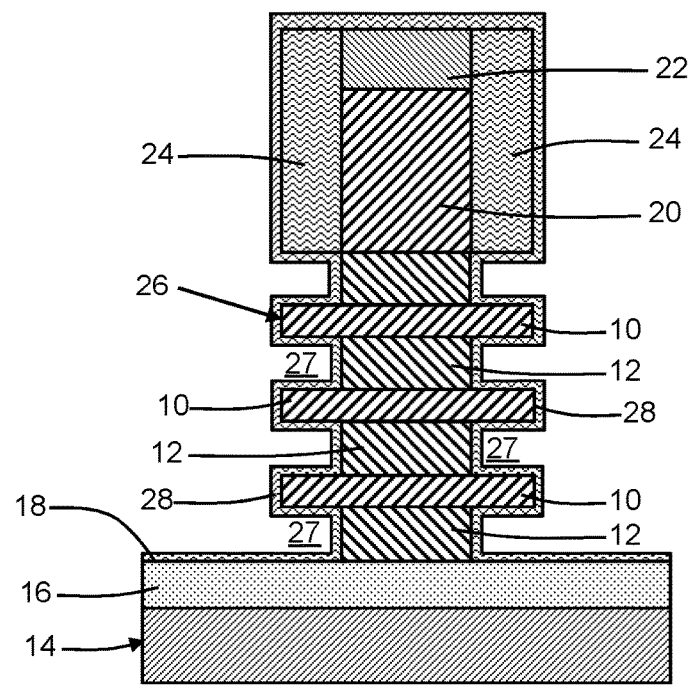

With reference to FIG. 4 in which like reference numerals refer to like features in FIG. 3 and at a subsequent fabrication stage of the processing method, a conformal dielectric layer 28 is applied that coats the vertical surfaces 11 of the semiconductor layers 10, the vertical surfaces 13 of the sacrificial semiconductor layers 12 inside the cavities 27, and the horizontal surfaces 15 of the semiconductor layers 10 over surface areas inside the cavities 27, as well as the exterior surfaces of the dielectric cap 22 and the dielectric spacers 24. The conformal dielectric layer 28 also forms on the top surface 18 of the dielectric layer 16. The conformal dielectric layer 28 may be composed of a dielectric material, such as silicon nitride ($Si_3N_4$), deposited by atomic layer deposition (ALD).

The thickness of the conformal dielectric layer 28 is selected such that the cavities 27 are not pinched off during the deposition of the constituent dielectric material. In an embodiment, the thickness of the conformal dielectric layer 28 is selected to be less than 30 percent of the thickness of each sacrificial semiconductor layer 12. In an embodiment, the thickness of the conformal dielectric layer 28 is selected to be in a range of 20 percent to 30 percent of the thickness of the each sacrificial semiconductor layer 12. As a numerical example, each sacrificial semiconductor layer 12 may have a thickness of 10 nm and the conformal dielectric layer 28 may have a thickness of 2 nm to 3 nm.

Figure 5:
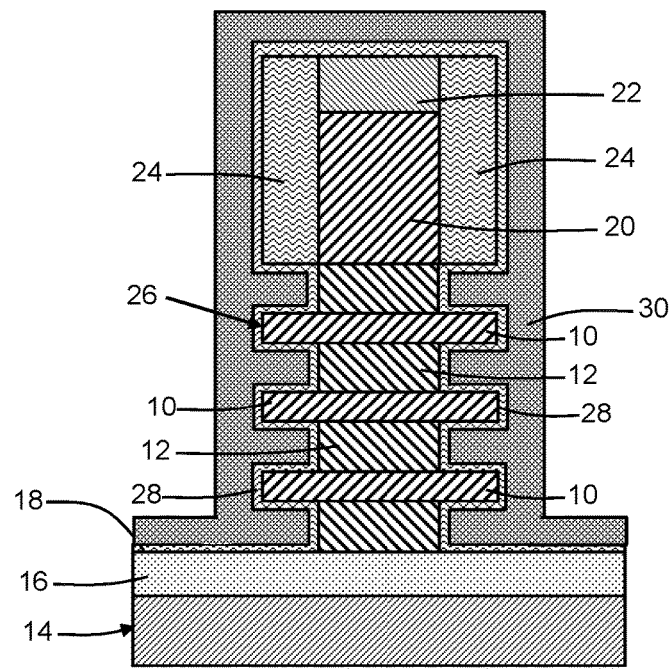

With reference to FIG. 5 in which like reference numerals refer to like features in FIG. 4 and at a subsequent fabrication stage of the processing method, a dielectric layer 30 is applied that fills the remaining space inside the cavities 27 (FIG. 4) along the sidewalls of the fin 26. The dielectric layer 30 coats the vertical surfaces 13 of the sacrificial semiconductor layers 12 and the horizontal surfaces 15 of the semiconductor layers 10 inside the cavities 27, the vertical surfaces 11 of the semiconductor layers 10, the exterior surface of the dielectric cap 22, and the exterior surfaces of the dielectric spacers 24. The dielectric layer 30 also forms on the conformal dielectric layer 28 covering the top surface 18 of the dielectric layer 16. The dielectric layer 30 may be composed of a dielectric material, such as silicon dioxide ($SiO_2$), deposited by atomic layer deposition (ALD). The dielectric material of the dielectric layer 30 is selected to be removed selective to the dielectric material of the conformal dielectric layer 28.

Figure 6:
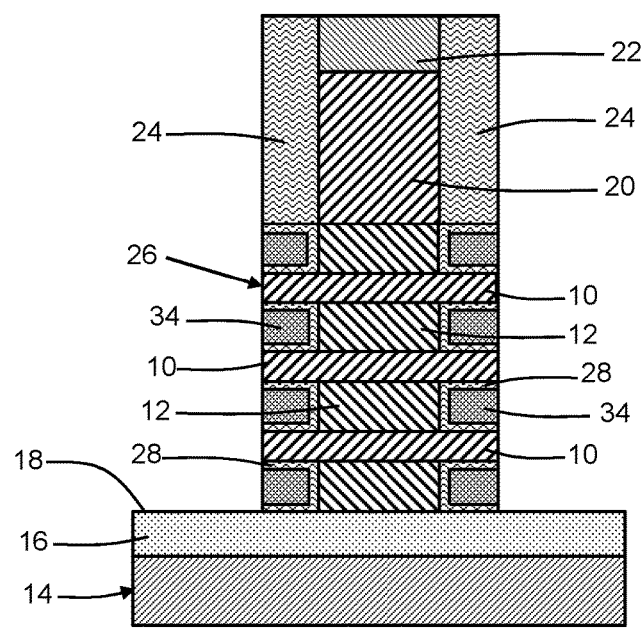

With reference to FIG. 6 in which like reference numerals refer to like features in FIG. 5 and at a subsequent fabrication stage of the processing method, dielectric spacers 34 are formed from the dielectric layer 30 in the cavities 27 between adjacent pairs of the semiconductor layers 10. Sections of the conformal dielectric layer 28 are located between the dielectric spacers 34 and the horizontal surfaces 15 of semiconductor layers 10, and between the dielectric spacers 34 and the vertical surfaces 13 of sacrificial semiconductor layers 12. Sections of the conformal dielectric layer 28 are removed from the vertical surfaces 11 of the semiconductor layers 10, which re-exposes the vertical surfaces 11 at the sidewalls of the fin 26. The dielectric spacers 34 may be formed using one or more isotropic etching processes that etch back and completely remove the portions of the dielectric material of conformal dielectric layer 28 and the portions of the dielectric material of dielectric layer 30 that are located outside of the cavities 27. Isotropic etching removes material in multiple directions (e.g., in a lateral direction and in a vertical direction). The conformal dielectric layer 28 masks the top surface 18 of the dielectric layer 16 during the performance of the etching process that etches the dielectric layer 30.

Figure 7:
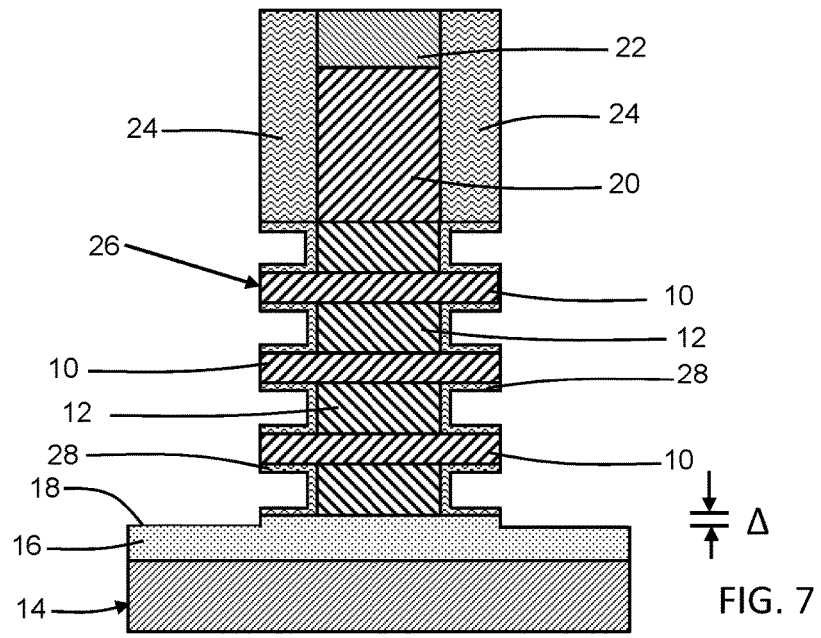

With reference to FIG. 7 in which like reference numerals refer to like features in FIG. 6 and at a subsequent fabrication stage of the processing method, the dielectric spacers 34 are removed from the cavities 27 selective to the sections of the conformal dielectric layer 28 coating the cavities 27. For example, the dielectric spacers 34 may be removed by a wet chemical etching process using, for example, buffered hydrofluoric acid that removes the dielectric material of the dielectric layer 30 selective to the dielectric material of the conformal dielectric layer 28. The removal of the dielectric spacers 34 reopens the portions of the cavities 27 that are not filled by sections of the conformal dielectric layer 28. The conformal dielectric layer 28 is located between the open space inside each cavity 27 and the respective vertical surface 13 of the sacrificial semiconductor layer 12. The conformal dielectric layer 28 is also located between the open space inside each cavity 27 and the respective horizontal surfaces 15 of the involved semiconductor layers 10.

The wet chemical etching process also etches the dielectric layer 16 such that the top surface 18 of the dielectric layer 16 is recessed by a vertical distance, $\Delta$, outside of an area masked by the fin 26 and conformal dielectric layer 28. The result is that the dielectric layer 16 adjacent to the fin 26 is recessed over an area that is not within the area covered by the fin 26 and a portion of the conformal dielectric layer 28.

Figure 8:
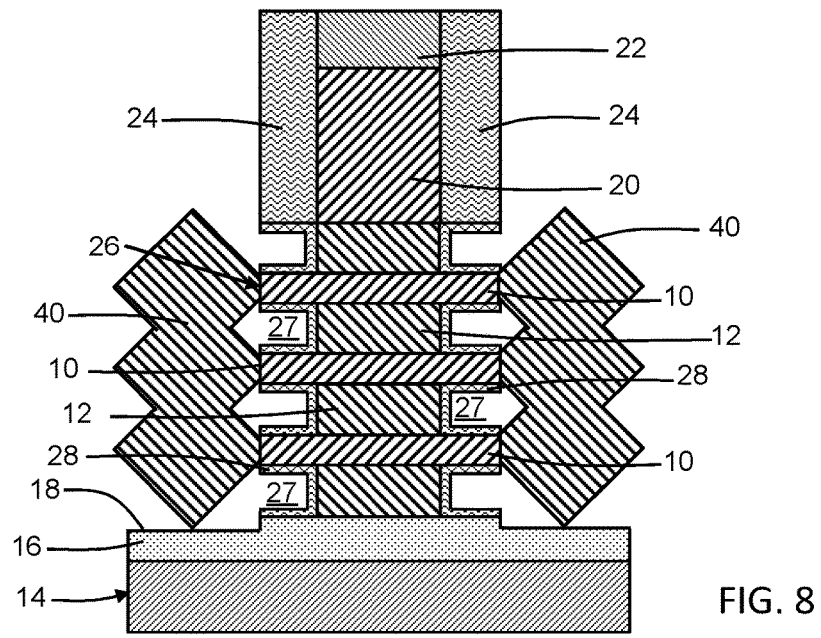

With reference to FIG. 8 in which like reference numerals refer to like features in FIG. 7 and at a subsequent fabrication stage of the processing method, the vertical surfaces 11 of the semiconductor layers 10 may be pre-cleaned, and source/drain regions 40 of a field-effect transistor 50 are formed adjacent to the vertical sidewalls of the fin 26. As used herein, the term "source/drain region" means a doped region of semiconductor material that can function as either a source or a drain of a field-effect transistor. The source/drain regions 40 are physically connected with the vertical surfaces 11 of the semiconductor layers 10 and are physically spaced from the vertical surfaces 13 of sacrificial semiconductor layers 12 that are covered by the conformal dielectric layer 28.

The semiconductor material constituting the source/drain regions 40 may be heavily doped to have either p-type electrical conductivity or n-type electrical conductivity. In an embodiment, the source/drain regions 40 may be formed by a selective epitaxial growth (SEG) process in which semiconductor material nucleates for epitaxial growth on semiconductor surfaces (e.g., the semiconductor layers 10), but does not nucleate for epitaxial growth from insulator surfaces (e.g., dielectric layer 16, dielectric cap 22, dielectric spacers 24, and conformal dielectric layer 28).

The source/drain regions 40 physically occlude the cavities 27 such that the open spaces defined by the cavities 27 are closed and sealed to define air gap spacers. The air gap spacers inside the closed cavities 27 may be characterized by an effective permittivity or dielectric constant of near unity (vacuum permittivity). The closed cavities 27 may be filled by atmospheric air at or near atmospheric pressure, may be filled by another gas at or near atmospheric pressure, or may contain atmospheric air or another gas at a sub-atmospheric pressure (e.g., a partial vacuum). The conformal dielectric layer 28 only occupies a fraction of the space inside each of the cavities 27. The cavities 27 and the surrounding sections of the conformal dielectric layer 28 collectively define spacers with an effective dielectric constant that includes a contribution from the sections of the conformal dielectric layer 28 and a contribution from the air gap spacer inside the associated cavity 27, and that may have a composite dielectric constant represented by a linear combination (e.g., a volume-weighted sum) of the individual dielectric constants.

Figure 9:
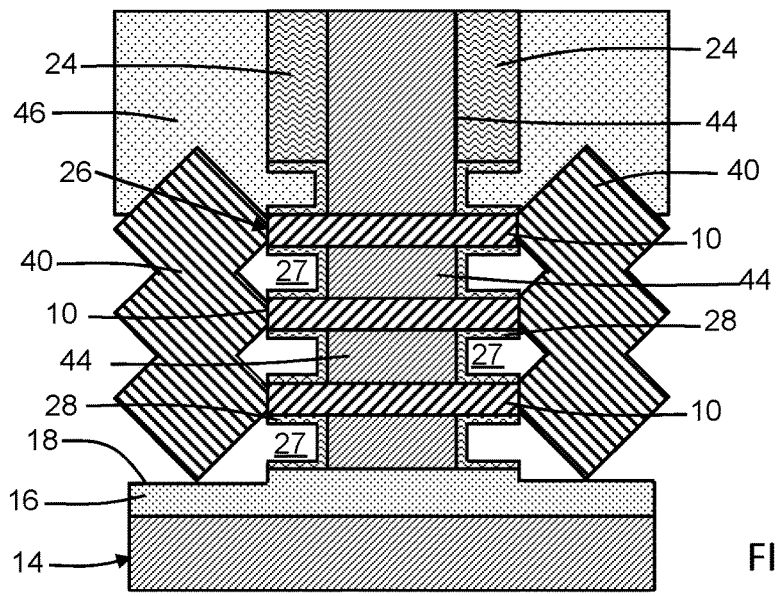

With reference to FIG. 9 in which like reference numerals refer to like features in FIG. 8 and at a subsequent fabrication stage of the processing method, a gap-fill layer 46 is deposited and planarized. The gap-fill layer 46 may be composed of a dielectric material, such as silicon dioxide (SiO$_2$), deposited by CVD. The sacrificial gate structure 20 and sacrificial semiconductor layers 12 are removed with one or more etching processes that are selective to the semiconductor layers 10, and are replaced with a functional gate structure 44 of the field-effect transistor 50 in a replacement gate process. The conformal dielectric layer 28 functions to mask the source/drain regions 40 from the etching process removing the sacrificial semiconductor layers 12. When the sacrificial semiconductor layers 12 are removed, a space is opened between the central portions of each adjacent pair of the semiconductor layers 10.

The semiconductor layers 10 of the field-effect transistor 50 that are arranged in a vertical stack. Sections of the functional gate structure 44 are located in the spaces formerly occupied by the removed sacrificial semiconductor layers 12 and surround the semiconductor layers 10 in a gate-all-around arrangement in which sections of the functional gate structure 44 are wrapped about the individual semiconductor layers 10. The surrounded semiconductor layers 10 define nanosheet channel layers of the field-effect transistor 50 in which channels for carrier flow are formed during operation.

The functional gate structure 44 may include a gate dielectric layer composed of a dielectric material, such as a high-k dielectric, and a metal gate electrode composed of one or more barrier metal layers and/or work function metal layers, such as titanium aluminum carbide (TiAlC) or titanium nitride (TiN), and a metal gate fill layer that is comprised of a conductor, such as tungsten (W). The gate dielectric layer is arranged between the gate electrode and the exterior surface of the semiconductor layers 10. The term "sacrificial gate structure" as used herein refers to a placeholder structure for a functional gate structure to be subsequently formed. The term "functional gate structure" as used herein refers to a permanent gate structure used to control output current (i.e., flow of carriers in the channel) of a semiconducting device.

Middle-of-line (MOL) and back-end-of-line (BEOL) processing follow, which includes formation of contacts and wiring for the local interconnect structure overlying the device structure, and formation of dielectric layers, via plugs, and wiring for an interconnect structure coupled by the interconnect wiring with the functional gate structure 44 and source/drain regions 40 of the field-effect transistor 50.

Figure 10:
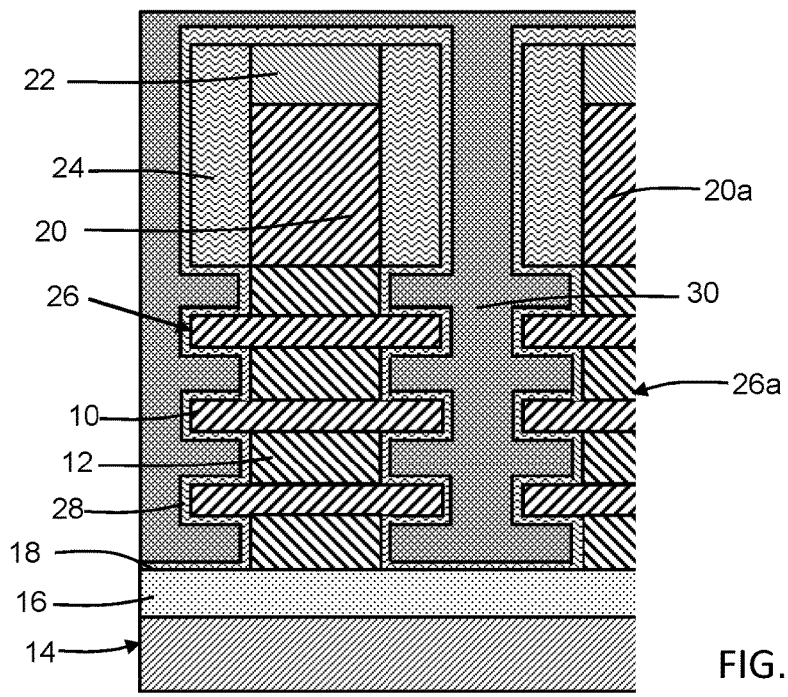
FIGS. 10-12 are cross-sectional views of device structures at successive stages of the processing method in accordance with embodiments of the invention.

With reference to FIG. 10 in which like reference numerals refer to like features in FIG. 4 and at a subsequent fabrication stage of an alternative embodiment of the processing method, the process flow may be altered for a situation in which the sacrificial gate structure 20 and fin 26 are located in close proximity to another sacrificial gate structure 20a and fin 26a. The close proximity may arise from a selection of a tight gate pitch of smaller critical dimension. In this embodiment, dielectric layer 30 completely fills up a gap 47 between sacrificial gate structure 20 and fin 26 and the other sacrificial gate structure 20a and fin 26a.

Figure 11:
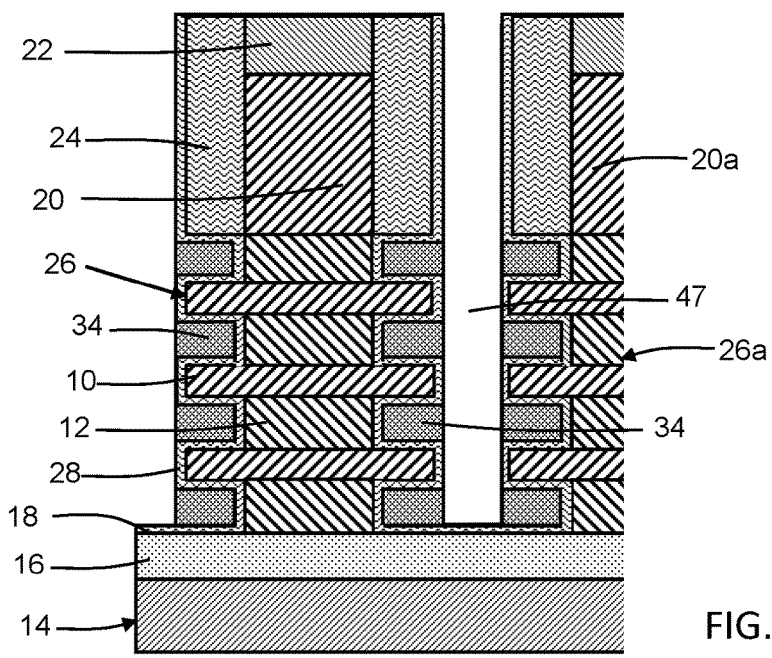

With reference to FIG. 11 in which like reference numerals refer to like features in FIG. 10 and at a subsequent fabrication stage of the processing method, an anisotropic etching process, instead of an isotropic etching process as in FIG. 6, may be used to etch back the dielectric layer 30 selective to the conformal dielectric layer 28 and to form the dielectric spacers 34 from the portions of the dielectric layer 30 in the cavities 27. The anisotropic etching process removes the dielectric layer 30 from the gap 47 between the adjacent sacrificial gate structures 20, 20a and fins 26, 26a. Anisotropic etching removes material uniformly in a single direction (i.e., vertically) and, in particular, in a vertical direction without an element of lateral etching such that the resulting sidewalls bordering the space 47 are vertical. Due to the etch selectively, the conformal dielectric layer 28 is intact following the anisotropic etching process and, in particular, is intact on the vertical surfaces 11 at the ends of the semiconductor layers 10 used subsequently to epitaxially grow and physically connect with the source/drain regions 42. The conformal dielectric layer 28 also masks the top surface 18 of the dielectric layer 16 during the performance of the etching process etching the dielectric layer 30.

Figure 12:
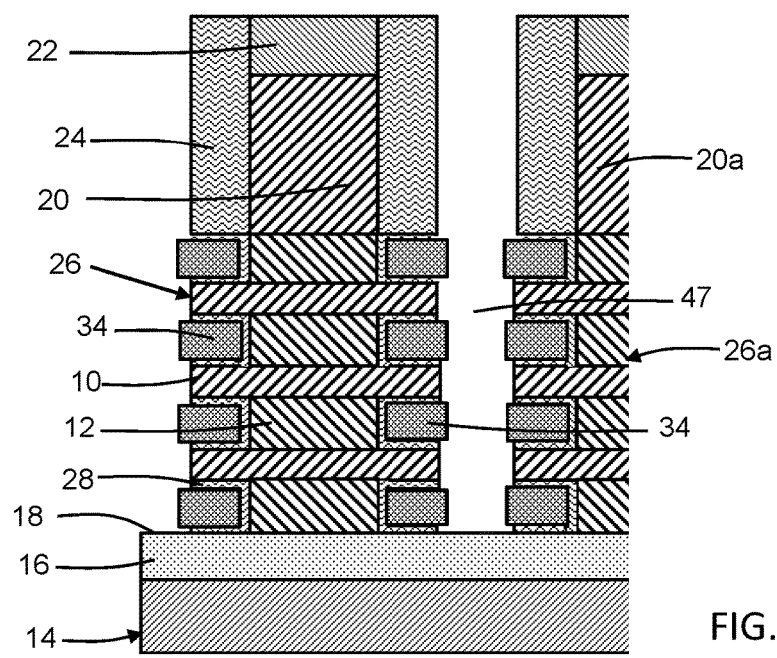

With reference to FIG. 12 in which like reference numerals refer to like features in FIG. 11 and at a subsequent fabrication stage of the processing method, an etching process is used to remove the sections of the conformal dielectric layer 28 from the vertical surfaces 11 of the semiconductor layers 10, which re-exposes the vertical surfaces 11 at the sidewalls of the fin 26. The etching process may be an isotropic etching process. In an embodiment in which the conformal dielectric layer 28 is composed of silicon nitride, the isotropic etching process may comprise a hot phosphoric acid etch. The process flow continues as described in FIGS. 5-8.

Figure 13:
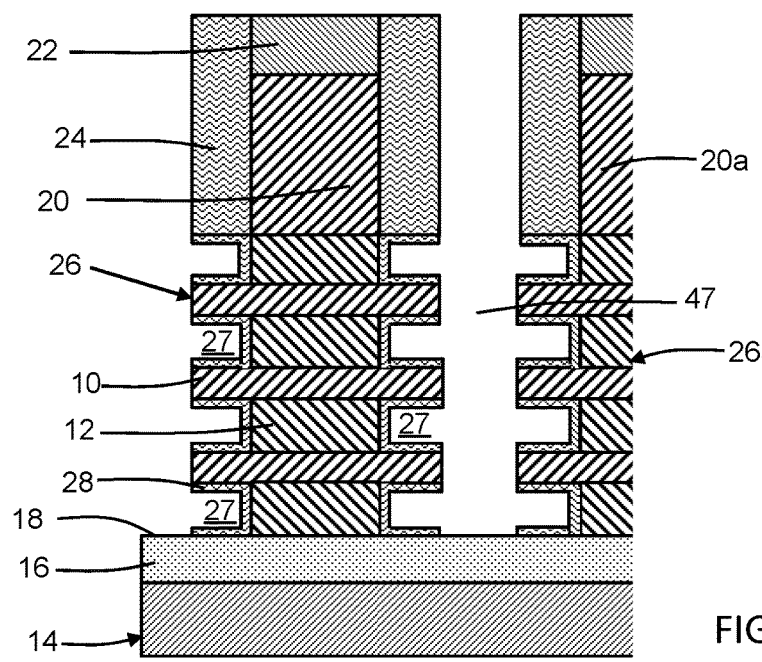
FIG. 13 is a cross-sectional view of device structures in accordance with alternative embodiments of the invention.

With reference to FIG. 13 in which like reference numerals refer to like features in in FIG. 12 and in accordance with an alternative embodiment of the processing method, the process flow may be further altered to change the material of the dielectric layer 30. In particular, the dielectric layer 30 may be replaced by a different type of sacrificial material, such as an organic planarization layer (OPL) material applied by spin-coating to fill the gap between the adjacent sacrificial gate structures 20, 20a and fins 26, 26a. As a result, the dielectric spacers 34 may be composed of a material having a different etch selectivity than the material constituting the dielectric layer 16. Through material selection, the dielectric spacers 34 may be removed selective to the material of the dielectric layer 16 without recessing the top surface 18 of the dielectric layer 16 adjacent to the fin 26. In an embodiment, the dielectric spacers 34 may be removed by an ashing process using an oxygen plasma, instead of with an etching process.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a field-effect transistor, the structure comprising:
   a fin including a first nanosheet channel layer and a second nanosheet channel layer arranged in a vertical stack;
   a gate structure including a section located in a space between the first nanosheet channel layer and the second nanosheet channel layer;
   a source/drain region connected with a portion of the first nanosheet channel layer and a portion of the second nanosheet channel layer; and
   an air gap spacer including a cavity surrounded by the portion of the first nanosheet channel layer, the portion of the second nanosheet channel layer, the section of the gate structure, and the source/drain region, and the source/drain region is arranged to close and seal the cavity.

2. The structure of claim 1 further comprising:
   a conformal dielectric layer including a first portion arranged between the air gap spacer and the section of the gate structure.

3. The structure of claim 2 wherein the conformal dielectric layer includes a second portion arranged between the portion of the first nanosheet channel layer and the air gap spacer, and the conformal dielectric layer includes a third portion arranged between the portion of the second nanosheet channel layer and the air gap spacer.

4. The structure of claim 2 wherein the conformal dielectric layer is comprised of silicon nitride.

5. The structure of claim 2 wherein the fin is located on a substrate, the substrate includes a dielectric layer adjacent to the fin, the conformal dielectric layer has a portion located on the dielectric layer, and the fin and the portion of the conformal dielectric layer mask a first area on the dielectric layer.

6. The structure of claim 5 wherein the dielectric layer includes a second area adjacent to the first area, and the dielectric layer is thinner in the second area than in the first area.

7. The structure of claim 6 wherein the source/drain region is arranged over the dielectric layer in the second area.

8. The structure of claim 1 wherein the air gap spacer is arranged horizontally between the section of the gate structure and the source/drain region.

9. The structure of claim 8 wherein the air gap spacer is arranged vertically between the portion of the first nanosheet channel layer and the portion of the second nanosheet channel layer.

10. A method for forming a field-effect transistor, the method comprising:
    forming a first fin that includes a first nanosheet channel layer and a second nanosheet channel layer arranged in a vertical stack;
    forming a cavity between a portion of the first nanosheet channel layer and a portion of the second nanosheet channel layer;
    epitaxially growing a source/drain region connected with the portion of the first nanosheet channel layer and the portion of the second nanosheet channel layer; and
    forming a first gate structure including a section located in a space between the first nanosheet channel layer and the second nanosheet channel layer,
    wherein the cavity is surrounded by the portion of the first nanosheet channel layer, the portion of the second nanosheet channel layer, the section of the first gate structure, and the source/drain region to define an air gap spacer, and the source/drain region is arranged to close and seal the cavity.

11. The method of claim 10 wherein the first nanosheet channel layer includes a first vertical surface, the second nanosheet channel layer includes a second vertical surface, the first nanosheet channel layer is separated from the second nanosheet channel layer by a sacrificial semiconductor layer, and forming the cavity between the portion of the first nanosheet channel layer and the portion of the second nanosheet channel layer comprises:
  laterally recessing the sacrificial semiconductor layer relative to the first vertical surface and the second vertical surface to form the cavity.

12. The method of claim 11 further comprising:
depositing a conformal dielectric layer inside the cavity; and
depositing a dielectric layer that fills the cavity to form a dielectric spacer and that covers the first vertical surface and the second vertical surface.

13. The method of claim 12 further comprising:
removing the dielectric layer from the first vertical surface and the second vertical surface with an isotropic etching process.

14. The method of claim 13 wherein the conformal dielectric layer is deposited on the first vertical surface and the second vertical surface, the dielectric layer is removed by the isotropic etching process from the first vertical surface and the second vertical surface without removing the dielectric spacer from the cavity, and further comprising:
  before the source/drain region is epitaxially grown, removing the dielectric spacer from the cavity, the conformal dielectric layer from the first vertical surface, and the conformal dielectric layer from the second vertical surface.

15. The method of claim 14 wherein the removal of the conformal dielectric layer from the first vertical surface and the second vertical surface exposes the first vertical surface and the second vertical surface for epitaxial growth of the source/drain region.

16. The method of claim 12 wherein the first fin and the first gate structure are separated by a gap from a second fin and a second gate structure, the dielectric layer fills the gap, and further comprising:
  removing the dielectric layer from the gap with an anisotropic etching process.

17. The method of claim 16 wherein the conformal dielectric layer is deposited on the first vertical surface and the second vertical surface, the dielectric layer is removed by the anisotropic etching process from the gap without removing the dielectric spacer from the cavity, and further comprising:
  before the source/drain region is epitaxially grown, removing the dielectric spacer from the cavity, the conformal dielectric layer from the first vertical surface, and the conformal dielectric layer from the second vertical surface.

18. The method of claim 16 wherein the removal of the conformal dielectric layer from the first vertical surface and the second vertical surface exposes the first vertical surface and the second vertical surface for epitaxial growth of the source/drain region.

19. The method of claim 16 wherein the dielectric spacer is comprised of an organic planarization layer (OPL) material or silicon dioxide, and the conformal dielectric layer is comprised of silicon nitride.

20. A structure for a field-effect transistor, the structure comprising:
  a fin including a first nanosheet channel layer and a second nanosheet channel layer arranged in a vertical stack;
  a gate structure including a section located in a space between the first nanosheet channel layer and the second nanosheet channel layer;
  a source/drain region connected with a portion of the first nanosheet channel layer and a portion of the second nanosheet channel layer;
  an air gap spacer surrounded by the portion of the first nanosheet channel layer, the portion of the second nanosheet channel layer, the section of the gate structure, and the source/drain region; and
  a conformal dielectric layer includes a first portion arranged between the air gap spacer and the section of the gate structure,
  wherein the fin is located on a substrate, the substrate includes a dielectric layer adjacent to the fin, the conformal dielectric layer has a portion located on the dielectric layer, the fin and the portion of the conformal dielectric layer mask a first area on the dielectric layer, the dielectric layer including a second area adjacent to the first area, and the dielectric layer is thinner in the second area than in the first area.

* * * * *